US012661867B2

(12) United States Patent
Furuyama et al.

(10) Patent No.: US 12,661,867 B2
(45) Date of Patent: *Jun. 23, 2026

(54) BONDING SHEET WITH PREFORM LAYER, METHOD FOR MANUFACTURING BONDED BODY, AND TO-BE-BONDED MEMBER WITH PREFORM LAYER

(71) Applicant: MITSUBISHI MATERIALS CORPORATION, Tokyo (JP)

(72) Inventors: Daiki Furuyama, Sanda (JP); Takuma Katase, Sanda (JP); Kohei Otogawa, Sanda (JP); Junta Inoue, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 138 days.

This patent is subject to a terminal disclaimer.

(21) Appl. No.: 18/279,492

(22) PCT Filed: Mar. 2, 2022

(86) PCT No.: PCT/JP2022/008812

§ 371 (c)(1),
(2) Date: Aug. 30, 2023

(87) PCT Pub. No.: WO2022/186262

PCT Pub. Date: Sep. 9, 2022

(65) Prior Publication Data

US 2024/0300215 A1     Sep. 12, 2024

(30) Foreign Application Priority Data

Mar. 2, 2021     (JP) ................................. 2021-032598

(51) Int. Cl.
*B32B 15/01*          (2006.01)
*B22F 1/054*          (2022.01)
(Continued)

(52) U.S. Cl.
CPC .............. *B32B 15/01* (2013.01); *B22F 1/054* (2022.01); *B22F 1/17* (2022.01); *B23K 35/00* (2013.01);
(Continued)

(58) Field of Classification Search
None
See application file for complete search history.

(56) References Cited

U.S. PATENT DOCUMENTS

2012/0104333 A1     5/2012  Takai et al.
2013/0001774 A1     1/2013  Masumori et al.
(Continued)

FOREIGN PATENT DOCUMENTS

EP          2960930 A1     12/2015
EP          3842228 A1      6/2021
(Continued)

OTHER PUBLICATIONS

English machine translation of JP 2015-109434, EPO, accessed Mar. 18, 2025.*

(Continued)

*Primary Examiner* — Xiaobei Wang
(74) *Attorney, Agent, or Firm* — Troutman Pepper Locke LLP

(57) ABSTRACT

This bonding sheet (10, 20) with a preform layer (13) is a bonding sheet (10, 20) for bonding a substrate (16) and an electronic component (17), the bonding sheet (10, 20) includes a copper sheet (11) and a porous preform layer (13) including copper particles (12) provided on one surface or both surfaces of the copper sheet (11), in which surfaces of the copper particles (12) are coated with copper nanoparticles (12*a*) having an average particle diameter smaller than an average particle diameter of the copper particles (12), the average particle diameter of the copper nanoparticles (12*a*)

(Continued)

calculated from a BET value is 9.59 nm or more and 850 nm or less, and an average porosity of the preform layer (13) is 11% or more and 78% or less.

4 Claims, 6 Drawing Sheets

(51) Int. Cl.

| | |
|---|---|
| *B22F 1/17* | (2022.01) |
| *B23K 35/00* | (2006.01) |
| *B32B 15/20* | (2006.01) |
| *B32B 37/06* | (2006.01) |
| *B32B 37/16* | (2006.01) |
| *H01L 23/00* | (2006.01) |
| *H10W 72/00* | (2026.01) |
| *H10W 72/30* | (2026.01) |

(52) U.S. Cl.
CPC .............. *B32B 15/20* (2013.01); *B32B 37/06* (2013.01); *B32B 37/16* (2013.01); *B22F 2301/10* (2013.01); *B32B 2264/1055* (2020.08); *B32B 2307/542* (2013.01); *B32B 2307/748* (2013.01); *B32B 2457/00* (2013.01); *H10W 72/07332* (2026.01); *H10W 72/322* (2026.01); *H10W 72/352* (2026.01)

(56) References Cited

U.S. PATENT DOCUMENTS

| | | |
|---|---|---|
| 2013/0105980 A1 | 5/2013 | Yasuda et al. |
| 2015/0218724 A1 | 8/2015 | Mevellec et al. |

FOREIGN PATENT DOCUMENTS

| | | |
|---|---|---|
| JP | 2001-152387 A | 6/2001 |
| JP | 2010121194 A | 6/2010 |
| JP | 2011-029178 A | 2/2011 |
| JP | 2013-091835 A | 5/2013 |
| JP | 2015-109434 A | 6/2015 |
| JP | 2015-533946 A | 11/2015 |
| JP | 2017-020082 A | 1/2017 |
| JP | 2018-001238 A | 1/2018 |
| JP | 2018-121012 A | 8/2018 |
| JP | 2019-036603 A | 3/2019 |
| JP | 2019-167616 A | 10/2019 |
| JP | 2019-220641 A | 12/2019 |
| TW | 201623639 A | 7/2016 |
| WO | 2011/114747 A1 | 9/2011 |
| WO | 2014/129626 A1 | 8/2014 |
| WO | 2020040120 A1 | 2/2020 |

OTHER PUBLICATIONS

K. Matsunaga et al., "High temperature reliability of joints using a Au nanoporous sheet", Proceedings of 25th Microelectronics Symposium, Sep. 2015, pp. 147-150, a cover page, a partial English translation and English abstract thereof.

International Search Report mailed May 31, 2022, issued for PCT/JP2022/008812 and English translation thereof.

International Search Report mailed Jan. 17, 2023, issued for PCT/JP2022/041470 and English translation thereof.

Tomohiko Nakamura et al., "Development of Porous Material Using Plating Technology," Kyoto Prefectural Technology Center for Small and Medium Enterprises, technical report, No. 31, 2003, pp. 36 to 38 and English abstract thereof.

Tomohiko Nakamura et al., "Development of Porous Material Using Plating Technology," Kyoto Prefectural Technology Center for Small and Medium Enterprises, technical report, No. 31, 2003, pp. 36 to 38 and English translation thereof.

Office Action mailed Jun. 19, 2025 in corresponding Taiwanese Patent Application No. 111107485 and English translation thereof.

* cited by examiner 10. 0 μm 1. 00 μm

BONDING SHEET WITH PREFORM LAYER, METHOD FOR MANUFACTURING BONDED BODY, AND TO-BE-BONDED MEMBER WITH PREFORM LAYER

The present application claims priority on Japanese Patent Application No. 2021-032598 filed on Mar. 2, 2021, the content of which is incorporated herein by reference.

TECHNICAL FIELD

The present invention relates to a bonding sheet having a porous preform layer for bonding a substrate and an electronic component in assembly or mounting of electronic components, a method for manufacturing a bonded body that is bonded using the preform layer, and a to-be-bonded member having a porous preform layer.

BACKGROUND ART

Conventionally, a solder material composed of lead, tin, or an alloy thereof has been widely used as a method for bonding dissimilar metals to each other. However, a lead-free solder material (a solder material that does not contain lead) is used in order to avoid the adverse effects of lead on the human body and the environment. Especially in power devices that are used in high temperature ranges, there is an increasing demand for materials that ensure high reliability even in high temperature ranges by using the sintering phenomenon of copper and silver.

From this background, a method using a bonding material is known in a case where two or more members are bonded, in the assembly of electronic components such as a power semiconductor chip and an LED. A method for manufacturing a bonded body using a paste containing micrometer-sized metal particles such as silver, gold, and copper, a binder, and a solvent as a type of bonding material is disclosed (see, for example, Patent Document 1 and Patent Document 2).

On the other hand, a preform sheet, which is a clad material using an intermetallic compound formed into a ribbon shape or a sheet shape by laminating two or more different metals, is disclosed as the bonding material (see, for example, Patent Document 3 and Patent Document 4). In Patent Documents 3 and 4, a preform material for encapsulating a semiconductor containing an intermetallic compound of Cu and Sn is produced.

In addition, a preform material in which a hard metal consisting of Cu, Au, Ag, or an alloy thereof and a soft metal consisting of Sn are combined is also disclosed (see, for example, Patent Document 5). Patent Document 5 also utilizes bonding of an intermetallic compound. Furthermore, a method of obtaining a nanoporous metal having a large surface area by a dealloying method has been proposed. Specifically, a nanoporous metal having a high surface area is obtained by leaving one metal or alloy and eluting other components with an acid or an alkali or electrochemically, for an alloy consisting of two or more types of metal elements. For example, a method for producing an Au nanoporous sheet by polishing an Au-65 at % Ag alloy with abrasive paper No. 2000 and then immersing the Au-65 at % Ag alloy in 60% $HNO_3$ kept at a temperature of 25° C. for 1 hour is disclosed as the dealloying method (see Non Patent Document 1).

The bonding performance is improved in the method for manufacturing a bonded body using a paste disclosed in Patent Documents 1 and 2. However, there has been a problem of requiring a relatively large manufacturing cost since it is necessary to use a device for carrying out a printing technique, dispensing, or the like, and it takes a lot of man-hours for coating. In addition, there has also been a problem that voids are generated by organic substances derived from the contained binder, flux, and solvent, leading to a concern about a decrease in bonding reliability due to the voids.

In addition, in the bonding of intermetallic compounds disclosed in Patent Documents 3 to 5, an intermetallic compound such as $Cu_6Sn_5$ is characterized by being hard. However, there is a concern that the strength is low, which cannot pass the strict reliability evaluation. In addition, the preform material disclosed in Patent Documents 3 and 4 is produced by rolling a metal powder, but has a problem that the strength of the preform material itself is low and the shape of the preform material is likely to collapse depending on how the preform material is handled.

Furthermore, the Au nanoporous sheet disclosed in Non Patent Document 1 is produced by etching Ag from an AuAg alloy. As the dealloying method similar to this, a method of producing an alloy foil from an alloy of Cu and a metal less noble than Cu and etching the metal less noble than Cu to manufacture a Cu porous sheet is assumed. However, according to the above-described methods, in both the Au nanoporous sheet and the Cu porous sheet, a sheet itself serving as a core also becomes porous, and a metal less noble than Ag or Cu remains in the sheet serving as a core; and thereby, there is a problem that the shape of the porous sheet is likely to collapse. For this reason, there is a need for a structure in which a preform material is firmly formed around a sheet serving as a core, or a structure in which a preform material is directly formed on a certain base plate.

CITATION LIST

Patent Documents

[Patent Document 1]
Japanese Unexamined Patent Application, First Publication No. 2019-167616
[Patent Document 2]
Japanese Unexamined Patent Application, First Publication No. 2019-220641
[Patent Document 3]
Japanese Unexamined Patent Application, First Publication No. 2018-001238
[Patent Document 4]
Japanese Unexamined Patent Application, First Publication No. 2018-121012
[Patent Document 5]
Japanese Unexamined Patent Application, First Publication No. 2019-036603

Non Patent Document

[Non Patent Document 1]
K. Matsunaga et al., "High temperature reliability of joints using a Au nanoporous sheet", pp. 147 to 150, Proceedings of the 25th Microelectronics Symposium, September 2015

SUMMARY OF INVENTION

Technical Problem

An object of the present invention is to provide a bonding sheet with a preform layer, in which the strength of the sheet itself is high. Another object of the present invention is to provide a method for manufacturing a bonded body having high bonding strength. A further object of the present invention is to provide a to-be-bonded member with a preform layer for obtaining a bonded body having high bonding strength.

Solution to Problem

A first aspect of the present invention is a bonding sheet with a preform layer, which is a bonding sheet for bonding a substrate and an electronic component, the bonding sheet including: a copper sheet; and a porous preform layer including copper particles provided on one surface or both surfaces of the copper sheet, in which surfaces of the copper particles are coated with copper nanoparticles having an average particle diameter smaller than an average particle diameter of the copper particles, the average particle diameter of the copper nanoparticles calculated from a BET value is 9.59 nm or more and 850 nm or less, an average porosity of the preform layer is 11% or more and 78% or less, and the average porosity of the preform layer is an arithmetic average of a porosity (P) obtained by the following Expression (1), based on a total area ($S_1$) of the preform layer and an area ($S_2$) of a pore portion in the preform layer, both of which are calculated by image analysis of a cross section of the bonding sheet with a scanning electron microscope.

$$P\,(\%) = (S_2/S_1) \times 100 \qquad (1)$$

A second aspect of the present invention is a method for manufacturing a bonded body including: a step of laminating a substrate and an electronic component with the bonding sheet with a preform layer of the first aspect interposed therebetween to obtain a laminate; and a step of heating the laminate in a state of being pressurized in a lamination direction to obtain a bonded body.

A third aspect of the present invention is a method for manufacturing a bonded body including: a step of preparing a substrate and an electronic component which are to be bonded to each other, in which a bonding surface of either one or both of the substrate and the electronic component is a copper surface or a nickel surface; a step of forming the porous preform layer of the first aspect on at least one surface of the copper surface or the nickel surface; a step of laminating the substrate and the electronic component with the preform layer interposed therebetween to obtain a laminate; and a step of heating the laminate in a state of being pressurized in a lamination direction to obtain a bonded body.

A fourth aspect of the present invention is a to-be-bonded member with a preform layer, which is either one of an electronic component or a substrate to be bonded to each other, the to-be-bonded member including: a copper surface or a nickel surface; and the porous preform layer of the first aspect provided on the copper surface or the nickel surface.

Advantageous Effects of Invention

The bonding sheet according to the first aspect of the present invention has high strength and exhibits no collapse of a shape during handling, since a porous preform layer is provided on one surface or both surfaces of a copper sheet which is a core sheet. In addition, in the porous preform layer, the surfaces of the copper particles are coated with copper nanoparticles having an average particle diameter smaller than the average particle diameter of the copper particles, and the average particle diameter of the copper nanoparticles calculated from the BET value is 9.59 nm or more and 850 nm or less. Therefore, in a case where the bonding sheet is disposed between the substrate and the electronic component to obtain a laminate, and the laminate is heated in a state of being pressurized in a lamination direction, a porous preform layer having a predetermined average porosity is densified. In addition, some of the copper particles are sintered, and the copper nanoparticles are easily sintered to bind the copper particles to each other. As a result, the bonding sheet becomes a bonding layer that firmly bonds the substrate and the electronic component.

In the method for manufacturing a bonded body according to the second aspect of the present invention, in a case where the laminate consisting of a substrate, the bonding sheet with a preform layer according to the first aspect, and an electronic component is heated in a state of being pressurized in a lamination direction, the porous preform layer is densified. In addition, some of the copper particles are sintered, and the copper nanoparticles are easily sintered to bind the copper particles to each other. As a result, a bonded body in which the bonding sheet is a bonding layer that firmly bonds the substrate and the electronic component is obtained.

In the method for manufacturing a bonded body according to the third aspect of the present invention, in a case where a substrate and an electronic component are laminated with the preform layer of the first aspect interposed therebetween to obtain a laminate, and the laminate is heated in a state of being pressurized in a lamination direction, the porous preform layer is densified. In addition, some of the copper particles are sintered, and the copper nanoparticles are easily sintered to bind the copper particles to each other. As a result, a bonded body in which the preform layer is a bonding layer that firmly bonds the substrate and the electronic component is obtained.

The to-be-bonded member with a preform layer according to the fourth aspect of the present invention has the porous preform layer of the first aspect on a copper surface or a nickel surface as a bonding surface. Therefore, in a case where this to-be-bonded member and either one of an electronic component or a substrate are laminated with the preform layer interposed therebetween to obtain a laminate, and the laminate is heated in a state of being pressurized in a lamination direction, the porous preform layer is densified. In addition, some of the copper particles are sintered, and the copper nanoparticles are easily sintered to bind the copper particles to each other. As a result, the to-be-bonded member can be firmly bonded to the electronic component or the substrate.

BRIEF DESCRIPTION OF DRAWINGS

FIG. 4(*a*) is a view in which a bonding sheet is placed on a substrate, FIG. 4(*b*) is a view in which an electronic component is placed on the bonding sheet, and then the laminate is heated while being pressurized, and FIG. 4(*c*) is a view showing a bonded body produced by pressurization and heating.

FIG. 5(*a*) to FIG. 5(*d*) are views in which a preform layer is formed on a part of a substrate by electrolytic copper alloy plating, and FIG. 5(*e*) to FIG. 5(*h*) are views in which an electronic component is placed on the preform layer, and then the laminate is heated while being pressurized to produce the bonded body.

DESCRIPTION OF EMBODIMENTS

Next, embodiments for carrying out the present invention will be described with reference to the drawings.

First Embodiment

[Bonding Sheet]

Figure 1:
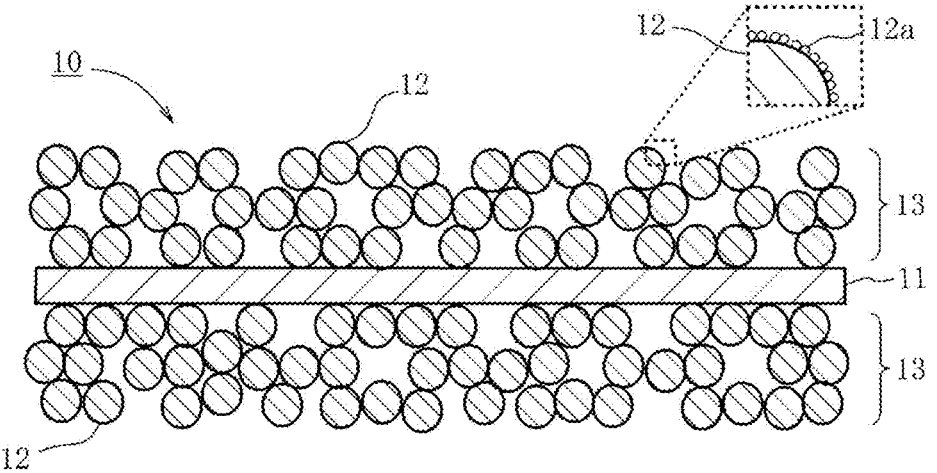
FIG. 1 is a configuration view of a bonding sheet schematically showing a porous preform layer according to a first embodiment of the present invention.
Figure 3:
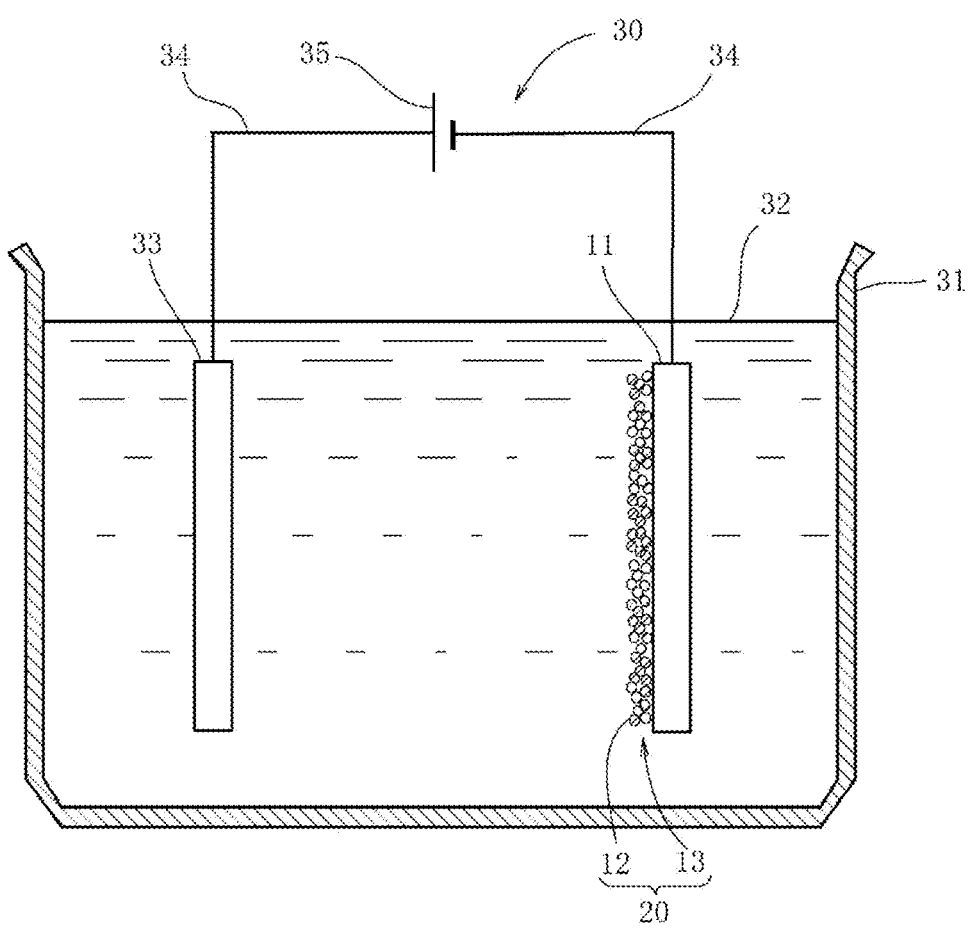
FIG. 3 is a view showing a situation in which a preform layer is formed on one surface of the copper sheet by the electrolytic copper alloy plating method according to the first embodiment of the present invention.
Figure 4:
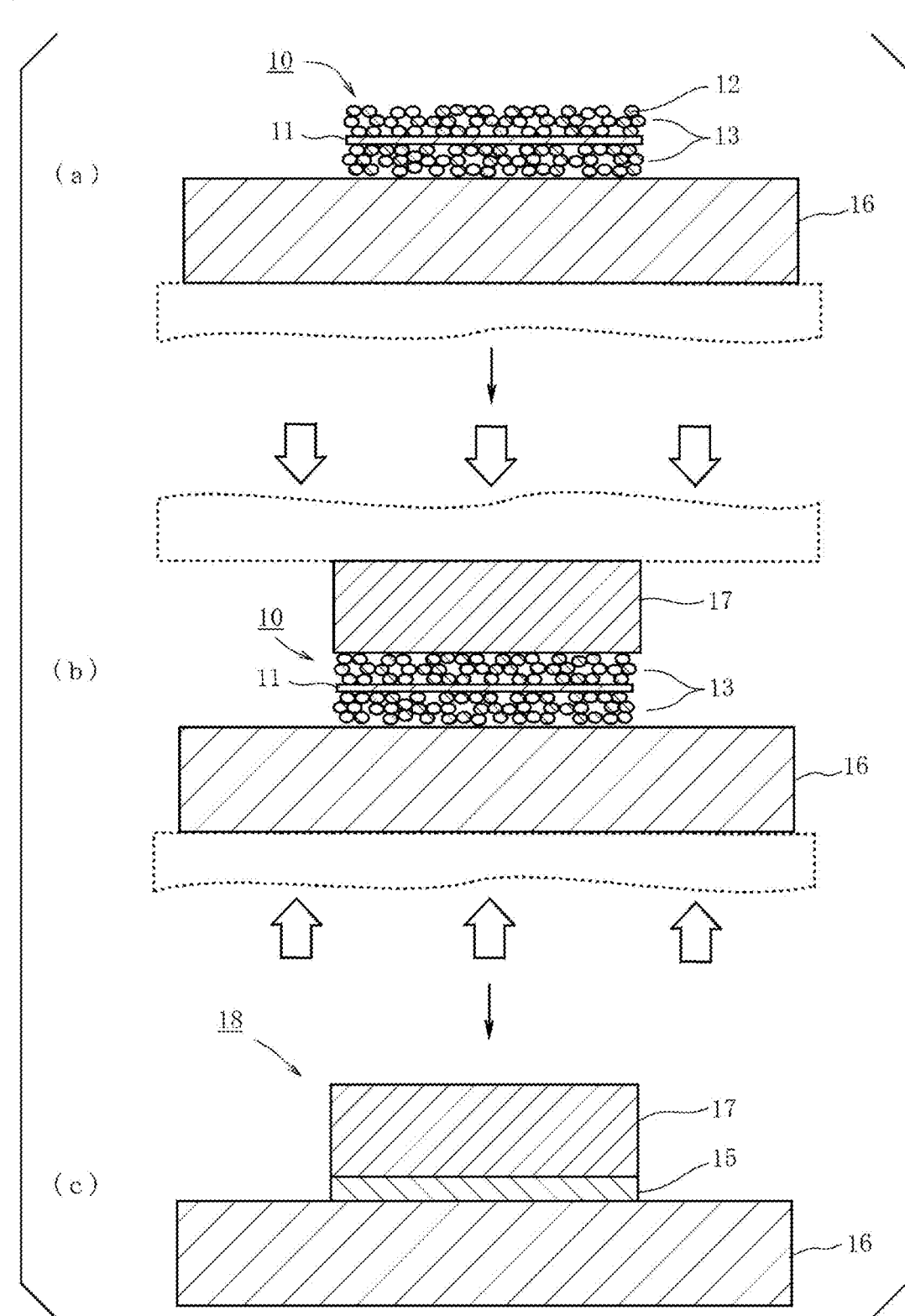
FIG. 4 is a view showing a method for manufacturing a bonded body according to the first embodiment of the present invention.

As shown in FIG. 1, a bonding sheet 10 of the first embodiment includes a copper sheet 11 and a porous preform layer 13 including copper particles 12 provided on both surfaces of the copper sheet. As shown in FIG. 4(*a*) to FIG. 4(*c*), the bonding sheet 10 is used to form a bonding layer 15 that bonds an electronic component 17 to a substrate 16 by being interposed between the substrate 16 represented by a base plate and the electronic component 17 represented by a semiconductor chip element. As shown in FIG. 3, a bonding sheet 20 including the porous preform layer 13 including the copper particles 12 formed on one surface of the copper sheet 11 may be used. Since the bonding sheets 10 and 20 of the present embodiment include the copper sheet 11, unlike the preform materials disclosed in Patent Documents 3 and 4, the bonding sheets 10 and 20 exhibit features of having high strength and of the shape being less likely to collapse.

(Copper Sheet: Copper Foil)

The thickness of the copper sheet 11 is preferably 10 µm to 90 µm and more preferably 15 µm to 50 µm. In a case where the thickness is less than the lower limit value of 10 µm, the copper sheet is difficult to handle during the manufacturing of the bonding sheet. In a case where the thickness is more than the upper limit value of 90 µm, the flexibility of the copper sheet is reduced and the followability of the bonding layer to surface irregularities is deteriorated, which may lead to a concern about the reliability of the bonding. The thickness of the copper sheet 11 is obtained by the following method. First, the copper sheet 11 which is a copper foil is completely covered with an epoxy resin, then the copper sheet 11 is cut perpendicular to the foil surface direction, and the cut surface is polished by an argon ion beam. Next, the polished surface is observed by a scanning electron microscope (SEM) to measure the thickness of the copper foil at 100 or more locations at random, and an average value of the measured values is defined as the thickness of the copper foil (copper sheet 11). In a case where the copper sheet is a copper foil, it is also possible to measure the thickness of the copper sheet by a digital caliper.

Pure copper or a copper alloy can be used as the copper foil constituting the copper sheet 11. For example, oxygen-free copper, tough pitch copper, or phosphorus deoxidized copper can be used. As the copper foil, a rolled copper foil obtained by rolling such a copper material can be used, or an electrolytic copper foil or the like produced by an electrolytic plating method can be used.

Any copper plating solution containing appropriate additives is used to produce an electrolytic copper foil. An example of the method for manufacturing an electrolytic copper foil is such that a cylindrical drum cathode is used, a copper foil is manufactured by electroplating while rotating the drum cathode, and the copper foil is wound to manufacture an electrolytic copper foil. On the other hand, as for the rolled copper foil, a Cu ingot is manufactured by casting, and then the Cu ingot is processed to have a desired thickness through hot rolling, cold rolling, and annealing steps. The rolled copper foil generally has smoother surface roughness than the electrolytic copper foil, but in consideration of the adhesiveness of the plating of a preform layer having a porous structure, which will be described later, it is preferable to carry out a surface treatment such as a roughening treatment on both the rolled copper foil and the electrolytic copper foil.

Both the rolled copper foil and the electrolytic copper foil are preferably degreased, washed with water, and washed with an acid before forming the preform layer on the surface of the foil.

(Preform Layer)

Figure 2:
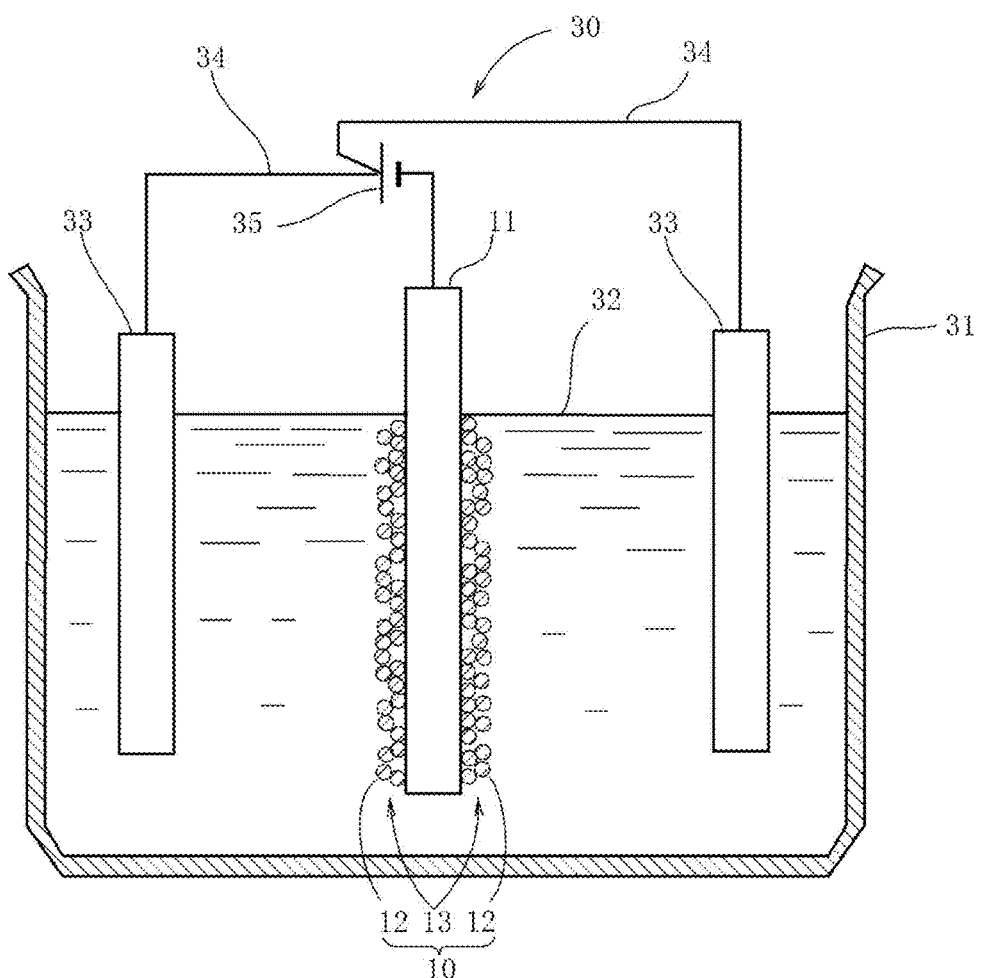
FIG. 2 is a view showing a situation in which preform layers are formed on both surfaces of a copper sheet by an electrolytic copper alloy plating method according to the first embodiment of the present invention.

As shown in FIG. 1 to FIG. 3, the porous preform layer 13 is formed in the form of an aggregate of copper particles in which the copper particles 12 are stacked on both surfaces or one surface of the copper sheet 11. The average porosity of the aggregate (the porous preform layer 13) including the copper particles 12 is 11% or more and 78% or less. In a case where the average porosity is less than 11%, there are few copper particles that contribute to sintering of the porous preform layer, and the sinterability of the copper particles is lowered. In a case where the average porosity is more than 78%, the percentage of voids in the porous preform layer becomes too high, the preform layer 13 becomes brittle, and the sinterability of the copper particles is lowered. Therefore, in a case of being formed into the bonding layer 15 shown in FIG. 4, the substrate 16 and the electronic component 17 cannot be bonded with high bonding strength. A preferred average porosity is 15% or more and 67% or less.

In addition, as shown in the enlarged view of FIG. 1, the surfaces of the copper particles 12 are preferably coated with copper nanoparticles having an average particle diameter smaller than the average particle diameter of the copper particles 12. As a result, as shown in FIG. 4, in a case where the porous preform layer 13 is pressurized, the copper particles are easily sintered to easily form a firm bonding layer 15. Since fine copper particles and copper nanoparticles that are finer than the copper particles are composited, it is difficult to calculate the average particle diameter of the copper nanoparticles from the microscopic image, and the average particle diameter is calculated from the BET value. As described above, the average particle diameter of the copper nanoparticles calculated from the BET value is preferably 9.59 nm or more and 850 nm or less.

As described above, the average particle diameter of the copper nanoparticles is smaller than the average particle diameter of the copper particles 12. The average particle diameter of the copper particles 12 is measured by the following method. The cross section of the porous preform layer 13 is observed with a scanning electron microscope (SEM). The contour of each of the copper particles 12 is specified, and the equivalent circle diameter of the copper particles 12 is measured. The average value of the equivalent circle diameters of the plurality of copper particles 12 is calculated, and the calculated average value is defined as the average particle diameter of the copper particles 12.

In addition, the thickness of the porous preform layer 13 is preferably 15 μm to 50 μm. In a case where the thickness of the preform layer is less than 15 μm, the strength of the preform layer itself is reduced; and thereby, it becomes difficult to handle. In a case where the thickness of the preform layer is more than 50 μm, it is difficult for the preform layer to follow the irregularities of the surface of the to-be-bonded member at the time of bonding, which may lead to a concern about a decrease in bonding strength.

The average porosity of the preform layer 13 described above is calculated by image analysis of the cross section of the bonding sheet 10 with a scanning electron microscope. The arithmetic average of the porosity (P) obtained by the following Expression (1) is defined as the average porosity. Specifically, images are taken three times in different fields of view, and the average value of the calculated porosities is defined as the average porosity.

$$P(\%)=(S_2/S_1)\times100 \qquad (1)$$

In the Expression (1), P is the porosity of the preform layer, $S_1$ is the total area of the preform layer, and $S_2$ is the area of the pore portion in the preform layer.

In addition, the average particle diameter of the copper nanoparticles described above is obtained by measuring the porous preform layer by the BET method. The measurement by the BET method is carried out using HM-model-1201 manufactured by Macsorb Co., Ltd. A copper sheet with a preform layer is cut into a 2 mm square, the cut copper sheet is charged in a measurement cell, and a specific surface area is measured by the single point BET method. The mass of the copper sheet is subtracted from the measurement value and the obtained value is converted into the mass of the preform layer itself. From the calculated BET measurement value, the particle diameter of the copper nanoparticles is calculated based on the following Expression (2). The coefficient 335.95 in the following Expression (2) is a value calculated from the theoretical values of the density of copper, the surface area of copper nanoparticles, and the volume of copper nanoparticles. The average particle diameter (d) of the copper nanoparticles is an average value of values calculated from the measurement values obtained by carrying out measurements three times by the BET method.

$$d\,(\mathrm{nm}) = 335.95 \big/ \big(BET \text{ measurement value } \big(\mathrm{m^2}\big/\mathrm{g}\big)\big) \qquad (2)$$

The porous preform layer contains copper particles and copper nanoparticles. Since the copper particles are larger than the copper nanoparticles, the amount of gas molecules adsorbed on the surfaces of the copper particles is smaller than the amount of gas molecules adsorbed on the surfaces of the copper nanoparticles. Therefore, the BET measurement value (measurement value of specific surface area) of the preform layer is greatly affected by the particle diameter of the copper nanoparticles. For this reason, the average particle diameter of the copper nanoparticles can be obtained from the BET measurement value of the preform layer.

[Method for Manufacturing Bonding Sheet]

The porous preform layer 13 on one surface or both surfaces of the copper sheet 11 is formed as follows as an example. A copper alloy plated film is formed by co-depositing copper and a metal species electrochemically less noble than copper on the surface of a copper sheet by an electrolytic plating method. Next, the less noble metal species in the copper alloy plated film is dealloyed to form a porous preform layer including copper particles.

In this method, a porous preform layer having a desired percentage of voids and a desired shape can be easily formed by controlling the deposition ratio and deposition form of copper and a metal species less noble than copper. In addition, in a case where a porous preform layer is formed on a surface of a long copper sheet, the porous preform layer can be manufactured in such a manner that a copper sheet wound on a roll is unwound from the roll, and while being wound on another roll, the copper sheet is electrolytically plated to form a copper alloy plated film and then the copper alloy plated film is subjected to a dealloying step.

Next, the methods of copper alloy plating and dealloying will be described in detail.

With regard to copper alloy plating, a copper-zinc alloy plated film is formed on one surface or both surfaces of a copper sheet by using, for example, a copper-zinc alloy plating solution containing a copper salt, a zinc salt, an additive for controlling the deposition of copper and zinc, and a solvent. This copper alloy plating essentially contains copper as an alloy species, and can be carried out by an electroless plating method or an electrolytic plating method. The metal species (for example, Fe or Mn) that is electrochemically less noble than copper can also be selected as the alloy species. The copper-zinc alloy plating solution preferably has a copper ion concentration of 0.0025 mol/L to 0.1 mol/L and a zinc ion concentration of 0.1 mol/L to 0.8 mol/L. The reason why the zinc ion concentration is set to be higher than the copper ion concentration is that copper is preferentially deposited as compared with zinc, due to the difference in standard oxidation-reduction potential. The pH of the plating solution is preferably 6.1 or higher for adjusting the deposition balance of copper and zinc. In addition, the cathode current density is set to be in a range of 0.3 A/dm² to 0.8 A/dm².

A copper salt and a zinc salt known as metal ion supply sources for a plating system can be used as supply sources of copper ions and zinc ions in copper alloy plating. Examples of the salt include sulfate, pyrophosphate, acetate, chloride, and sulfamate. Trisodium citrate or potassium pyrophosphate as a conductive salt or a supporting salt is used as an additive for controlling the deposition of copper and zinc to form a copper-zinc alloy plated film having a smooth surface. For example, a compound selected from an amino acid and a salt thereof, or a surfactant such as alkanolamine can be used as a brightening agent. An example of the surfactant is (ethylenedinitrilo)tetrakis(2-propanol). Any amino acid can be used as long as it is water-soluble and does not cause precipitation with a copper salt (copper ions) and a zinc salt (zinc ions) at any concentration. Examples of the amino acid include glycine, serine, alanine, tyrosine, aspartic acid, glutamic acid, histidine, and salts thereof. It is preferable to select an appropriate additive in order to realize a structure in which the surfaces of copper particles are coated with copper nanoparticles having an average particle diameter smaller than the average particle diameter of the copper particles when the dealloying is carried out.

Examples of the dealloying of the formed copper-zinc alloy plated film include a method of carrying out an etching reaction with a chemical liquid and a method of carrying out an electrochemical anode reaction. In the present embodiment, dealloying with an acid is carried out in such a manner that the copper alloy film is immersed in a solution containing hydrochloric acid at a concentration of 0.002 mol/L to 0.5 mol/L at a temperature of 20° C. to 35° C. for 30 minutes or more, depending on the thickness of the plated film, and stirred to carry out the dealloying of removing zinc from the copper-zinc alloy plated film. As a result, the porous preform layer 13 including the copper particles is formed on one surface or both surfaces of the copper sheet 11. The preform layer 13 is preferably dealloyed such that the zinc concentration after dealloying measured by energy dispersive X-ray analysis (EDX) is 0.6 at % or less.

Next, the copper sheet 11 having the porous preform layer 13 formed on one surface or both surfaces is washed with a washing solvent such as ethanol, water, or acetone, and then dried in the atmosphere using dry air. As a result, the bonding sheet 10 or 20 having the porous preform layer 13 formed on one surface or both surfaces of the copper sheet 11 is obtained, and the porous preform layer 13 includes copper particle aggregates and has an average porosity of 11% or more and 78% or less. In order to prevent the surface oxidation of the obtained bonding sheet, it is preferable to immerse the sheet in a rust inhibitor containing benzotriazole and a surfactant as main components for a predetermined period of time.

The total thickness of each of the bonding sheets 10 and 20 is 15 μm at the thinnest. That is, the thickness of the bonding sheet is 15 μm or more. The preferred total thickness of the bonding sheet is 20 μm to 50 μm. In a case where the total thickness of the bonding sheet is less than the lower limit value of 15 μm, there is a concern that the strength of the bonding sheet itself may be reduced. In a case where the total thickness of the bonding sheet is more than 50 μm, and in a case where the substrate is a base plate and the base plate to which an electronic component is bonded has warpage, there is a concern that the warpage cannot be absorbed. The total thickness of the bonding sheet is measured in the same manner as the thickness of the copper sheet 11.

[Method of Bonding Substrate and Electronic Component Using Bonding Sheet]

As shown in FIG. 4, a method of bonding the substrate 16 and the electronic component 17 using the bonding sheet 10 will be described. Examples of the substrate 16 include an oxygen-free copper plate, various heat dissipation base plates, a flame retardant type 4 (FR4) base plate, and a base plate such as Kovar. In addition, a substrate having nickel (Ni) formed on the bonding surface may be used. Examples of the electronic component 17 include electronic components such as a silicon chip element and an LED chip element.

First, the bonding sheet 10 is disposed at a predetermined position on the substrate 16 as shown in FIG. 4(*a*), and the electronic component 17 is mounted on the bonding sheet 10 as shown in FIG. 4(*b*). In this state, the bonding sheet 10 is heated in a heating furnace under a nitrogen atmosphere at a temperature of 250° C. to 350° C. for 1 minute to 30 minutes. In some cases, the substrate 16 and the electronic component 17 may be heated and bonded while applying a pressure of 1 MPa to 20 MPa. As a result, as shown in FIG. 4(*c*), the bonding sheet 10 becomes a bonding layer 15, and the substrate 16 and the electronic component 17 are bonded to produce a bonded body 18.

Second Embodiment

[To-be-Bonded Member on which Porous Preform Layer is Formed]

Figure 5:
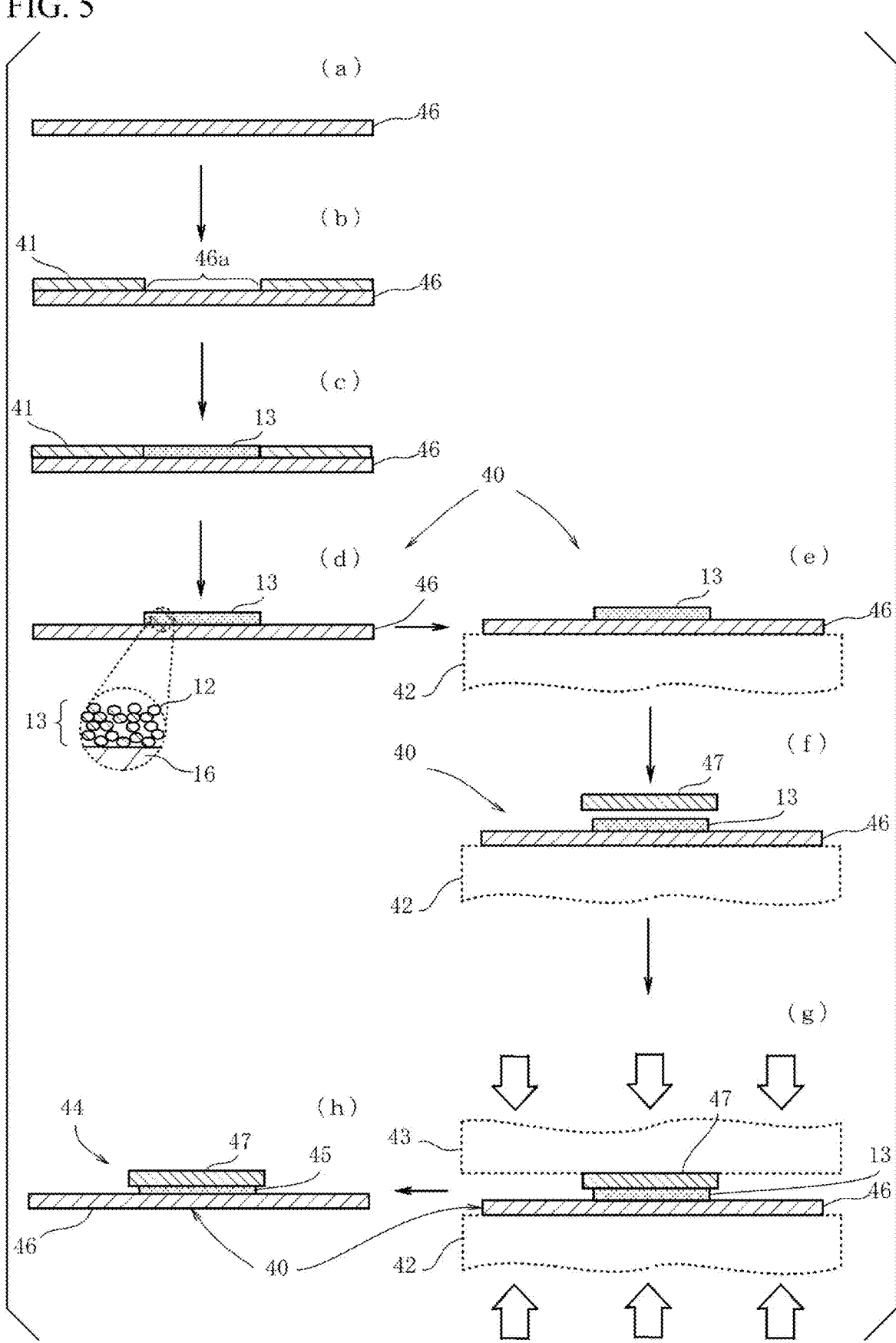
FIG. 5 is a view showing a method for manufacturing a bonded body according to a second embodiment of the present invention.

As shown in FIG. 5(*d*) and FIG. 5(*e*), a to-be-bonded member 40 of the second embodiment includes a substrate 46 and a porous preform layer 13 formed on the substrate 46, and the porous preform layer 13 has an average porosity of 11% or more and 78% or less. An electronic component is bonded to the to-be-bonded member 40. The substrate 46 (FIG. 5) itself in the second embodiment corresponds to the copper sheet 11 (FIG. 1) of the first embodiment. The porous preform layer 13 is the same as the porous preform layer 13 of the first embodiment. The substrate 46 has a copper surface, and is, for example, an oxygen-free copper plate or a base plate whose bonding surface is copper-metallized. In addition, the substrate 16 having a Ni surface as the bonding surface can also be used as the substrate 46. An example is an oxygen-free copper plate with a Ni surface formed by Ni plating.

The to-be-bonded member 40 including a porous preform layer formed thereon, which is the second embodiment, can be manufactured by the following method. In this method, the substrate 46 is prepared as shown in FIG. 5(*a*), the surface of the substrate 46 excluding a bonding surface 46*a* is masked with a resist film 41 as shown in FIG. 5(*b*), and in this state, the substrate 46 is put in a copper alloy plating solution to form the porous preform layer 13 on the bonding surface 46*a* as shown in FIG. 5(*c*). Next, the resist film 41 is removed to obtain the to-be-bonded member 40 as shown in FIG. 5(*d*). Although not shown, the porous preform layer 13 is formed by forming a copper alloy plated film on the bonding surface 46*a* with a copper alloy plating solution and then dealloying the copper alloy plated film. The copper alloy plating and dealloying can be carried out in the same manner as in the first embodiment. In the above-described description, the preform layer 13 is formed only on the bonding surface 46*a*, but the preform layer 13 may be formed on the entire surface of the substrate 46 without providing the resist film 41.

[Method of Bonding to-be-Bonded Member and Electronic Component]

An electronic component 47 such as a silicon chip element or an LED chip element is bonded onto the to-be-bonded member 40. First, as shown in FIG. 5(*e*), the to-be-bonded member 40, on which the porous preform layer 13 is formed, is placed on a pressure plate 42. Next, as shown in FIG. 5(*f*), the electronic component 47 is placed on the preform layer 13 to obtain a laminate. Next, as shown in FIG. 5(*g*), the laminate consisting of the to-be-bonded member 40 and the electronic component 47 is heated in a state of being pressurized in a lamination direction by the pressure plate 42 and a pressure plate 43. The conditions of the pressurization and heating are the same as the conditions of the pressurization and heating of the substrate 16 and the electronic component 17 shown in FIG. 4(*a*). As a result, as shown in FIG. 5(*h*), the preform layer 13 becomes a bonding layer 45, and the to-be-bonded member 40 and the electronic component 47 are bonded to obtain a bonded body 44.

Although not shown, a base plate including no preform layer on its surface (bonding surface) may be prepared as the substrate. For example, the substrate may be an oxygen-free copper plate or a base plate whose bonding surface is copper-metallized. In this case, the to-be-bonded member is an electronic component, and may have a copper surface or a nickel surface as the bonding surface and a preform layer provided on the copper surface or the nickel surface. In addition, although not shown, the preform layer may be formed on the bonding surface of the substrate and the preform layer may also be formed on the bonding surface of the electronic component. By forming the preform layer on both the substrate and the electronic component, the bonding strength between the substrate and the electronic component can be further increased, which is preferable.

EXAMPLES

Next, examples of the present invention will be described in detail together with comparative examples. In Examples 1 to 12 and Comparative Examples 1 to 6 shown below, a bonding sheet was manufactured by the method of the first embodiment. In addition, in Examples 13 to 20 and Comparative Examples 7 to 10, a porous preform layer was formed on an oxygen-free copper plate by the method of the second embodiment.

aqueous solution having a concentration of 10% by mass to wash the copper sheet with an acid. In the acid-washed copper sheet, copper-zinc plated films were formed on both surfaces of the copper sheet using a plating apparatus 30 shown in FIG. 2.

A copper-zinc alloy plating bath having the following composition was prepared. In addition, the plating conditions are also shown below. Table 1 which will be given later shows characteristic items among the composition of the plating bath and plating conditions of Example 1.

[Composition]

Copper sulfate pentahydrate (as $Cu^{2+}$): 0.01 mol/L

Zinc sulfate heptahydrate (as $Zn^{2+}$): 0.15 mol/L

Potassium pyrophosphate: 0.3 mol/L (Ethylenedinitrilo)tetrakis(2-propanol): 0.01 mol/L Serine which was an amino acid: 0.001 mol/L Ion exchange water: balance

[Plating Conditions]

Bath temperature: 30° C.

pH of bath: 8.6

Cathode current density: 0.5 A/dm²

TABLE 1

| | Thickness of copper sheet (rolled copper foil) (μm) | Concentration of copper sulfate pentahydrate (mol/L) | Concentration of zinc sulfate heptahydrate (mol/L) | Concentration of potassium pyrophosphate (mol/L) | Concentration of trisodium citrate (mol/L) | Concentration of (ethylenedinitrilo) tetrakis(2-propanol) (mol/L) | Concentration of amino acid (serine) (mol/L) | pH of plating bath | Cathode current density (A/dm²) |
|---|---|---|---|---|---|---|---|---|---|
| Example 1 | 15 | 0.01 | 0.15 | 0.3 | — | 0.01 | 0.001 | 8.6 | 0.5 |
| Example 2 | 50 | 0.01 | 0.15 | 0.3 | — | 0.01 | 0.001 | 8.6 | 0.5 |
| Example 3 | 15 | 0.01 | 0.15 | 0.3 | — | 0.01 | 0.001 | 8.6 | 0.3 |
| Example 4 | 50 | 0.01 | 0.15 | 0.3 | — | 0.01 | 0.001 | 8.6 | 0.3 |
| Example 5 | 15 | 0.0025 | 0.3 | — | 0.5 | 0.02 | 0.1 | 6.3 | 0.5 |
| Example 6 | 50 | 0.0025 | 0.3 | — | 0.5 | 0.02 | 0.1 | 6.3 | 0.5 |
| Example 7 | 15 | 0.0025 | 0.3 | — | 0.5 | 0.02 | 0.1 | 6.3 | 0.3 |
| Example 8 | 50 | 0.0025 | 0.3 | — | 0.5 | 0.02 | 0.1 | 6.3 | 0.3 |
| Example 9 | 15 | 0.01 | 0.3 | — | 0.5 | 0.02 | 0.1 | 6.1 | 0.5 |
| Example 10 | 50 | 0.01 | 0.3 | — | 0.5 | 0.02 | 0.1 | 6.1 | 0.5 |
| Example 11 | 15 | 0.01 | 0.3 | — | 0.5 | — | 0.1 | 6.1 | 0.3 |
| Example 12 | 50 | 0.01 | 0.3 | — | 0.5 | — | 0.1 | 6.1 | 0.3 |
| Comparative Example 1 | 15 | 0.5 | 0.1 | 0.5 | — | 0.1 | 0.1 | 4.5 | 0.2 |
| Comparative Example 2 | 50 | 0.5 | 0.1 | 0.5 | — | 0.1 | 0.1 | 4.5 | 0.2 |
| Comparative Example 3 | 15 | 0.0015 | 0.3 | — | 0.5 | 0.05 | 0.2 | 6.1 | 0.5 |
| Comparative Example 4 | 50 | 0.0015 | 0.3 | — | 0.5 | 0.1 | 0.2 | 6.1 | 0.5 |
| Comparative Example 5 | 15 | 0.01 | 0.15 | 0.3 | — | — | — | 8.6 | 0.5 |
| Comparative Example 6 | 15 | 0.01 | 0.15 | 0.3 | — | 0.01 | — | 8.6 | 0.5 |

Example 1

(Manufacturing Example of Bonding Sheet by Method of First Embodiment)

Figure 6:
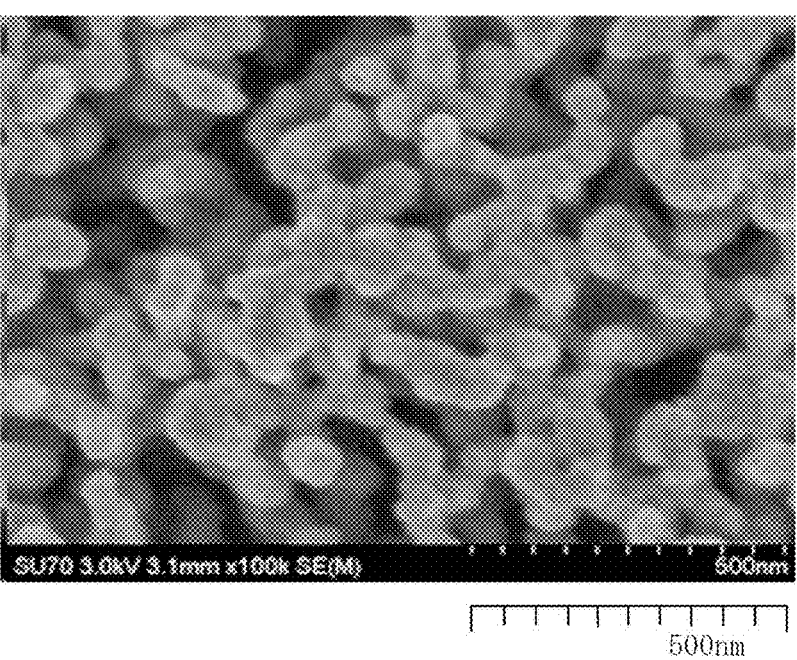
FIG. 6 is a scanning electron micrograph of a surface of a preform layer of Example 1 manufactured by the method according to the first embodiment of the present invention.

First, a rolled copper foil of oxygen-free copper having a thickness of 15 μm was used as a copper sheet. As a treatment prior to copper plating of the copper sheet, the copper sheet was immersed in a degreasing solution containing sodium hydroxide as a main component. Next, the copper sheet was pulled up from the degreasing solution, washed with water, and then washed with an ethanol solution. Next, the copper sheet was immersed in a sulfuric acid The copper-zinc plated film produced under the above-described conditions was immersed in a solution containing hydrochloric acid at a concentration of 0.05 mol/L at 27° C., and the solution was stirred for 60 minutes. As a result, zinc was removed by dealloying from the copper-zinc alloy plated film. In order to prevent the surface oxidation of the dealloyed sheet, the sheet was subjected to a rust-inhibiting treatment by being immersed in a rust inhibitor containing benzotriazole and a surfactant as main components for 30 seconds. As a result, a bonding sheet having porous preform layers including copper particles formed on both surfaces of the copper sheet was obtained. FIG. 6 shows a scanning electron micrograph of the surface of the preform layer of Example 1.

Examples 2 to 12 and Comparative Examples 1 to 6

In Examples 2 to 12 and Comparative Examples 1 to 6, the thickness of the copper sheet consisting of the rolled copper foil of oxygen-free copper was the same as in Example 1 or changed. The concentration of copper sulfate pentahydrate was the same as in Example 1 or changed. The concentration of zinc sulfate heptahydrate was the same as in Example 1 or changed. The concentration of potassium pyrophosphate or the concentration of trisodium citrate was the same as in Example 1 or changed. The concentration of (ethylenedinitrilo)tetrakis(2-propanol) was the same as in Example 1 or changed. The concentration of the amino acid was the same as in Example 1 or changed. In addition, the pH of the plating bath was the same as in Example 1 or changed. The cathode current density at the time of plating was the same as in Example 1 or changed. A copper-zinc plated film was formed in the same manner as in Example 1 except for the above-described matters. Table 1 above shows characteristic items among the composition of the plating bath and plating conditions of each of Examples 2 to 12 and Comparative Examples 1 to 6.

The copper-zinc plated film produced under the above-described conditions was subjected to dealloying of zinc and a rust-inhibiting treatment in the same manner as in Example 1 to obtain a bonding sheet having porous preform layers including copper particles formed on both surfaces of the copper sheet.

<Comparison Evaluation 1>

<Average Porosity of Porous Preform Layer and Average Particle Diameter of Copper Nanoparticles>

The average porosity of the porous preform layer of each of the 18 types of bonding sheets obtained in Examples 1 to 12 and Comparative Examples 1 to 6, and the average particle diameter of the copper nanoparticles that coated the copper particles constituting the preform layer were obtained by the methods described above.

<Manufacturing of Bonded Body>

Each of the 18 types of bonding sheets obtained in Examples 1 to 12 and Comparative Examples 1 to 6 was disposed between the substrate 16 and a chip 17 which was an electronic component, as shown in FIG. 4(a) and FIG. 4(b), and the resulting structure was heated while being pressurized to obtain a bonded body 18.

The substrate 16 consisted of a 33 mm square oxygen-free copper plate (thickness: 2 mm) or a 33 mm square oxygen-free copper plate having a Ni-plated surface (Ni plating thickness: 3 μm, total thickness: 2 mm). The chip 17 consisted of a 2.5 mm square Si wafer (thickness: 200 μm) of which the outermost surface (bonding surface) was subjected to copper metallization.

Next, the bonding sheet 10 was interposed between the chip 17 and the substrate 16 to produce a laminate. Furthermore, this laminate was held in a nitrogen atmosphere at a temperature of 320° C. and at a pressure of 8 MPa for 15 minutes using a pressurizing and heating bonding apparatus (HTB-MM, manufactured by Alpha-Design Co., Ltd.) to bond the substrate 16 and the chip 17 through the bonding layer 15. The shear strength of each of the 18 types of bonded bodies 18 was measured as follows.

<Method for Measuring Shear Strength of Bonded Body>

The shear strength (bonding strength) of the bonded body was measured using a shear strength evaluation tester (Dage Series 4000 Bond Tester, manufactured by Nordson Advanced Technology (Japan) K.K.). Specifically, the shear strength was measured as follows. The substrate (oxygen-free copper plate) of the bonded body was horizontally fixed, a Si wafer with a chip was pushed in a horizontal direction from the side by means of a shear tool at a position 50 μm above the surface (upper surface) of the bonding layer, and then the strength at the time when the chip was broken was measured. The moving speed of the shear tool was set to 0.1 mm/sec. The strength test was carried out three times per one condition, and the arithmetic average value of the obtained values was defined as the measurement value of the bonding strength. The shear strengths of the 18 types of bonded bodies are shown in Table 2 below. In a case where the bonding strength was 15 MPa or more, it was evaluated as "Excellent", in a case where the bonding strength was 1.7 MPa or more and less than 15 MPa, it was evaluated as "Good", and in a case where the bonding strength was less than 1.7 MPa, it was evaluated as "Fail". "-" in the column of "Bonding strength" of Table 2 means a case where the chip and the substrate were attempted to be bonded but were not bonded, or a case where the chip was peeled off before the bonding strength was measured.

TABLE 2

| | Thickness of copper sheet (μm) | Average porosity of preform layer (%) | Average particle diameter of copper nanoparticles (nm) | Bonded body | | | |
| --- | --- | --- | --- | --- | --- | --- | --- |
| | | | | Type of substrate | Chip | Bonding strength (MPa) | Bonding evaluation |
| Example 1 | 15 | 35 | 61.8 | Oxygen-free copper plate | 2.5 mm square copper | 38.1 | Excellent |
| Example 2 | 50 | 35 | 63.5 | Oxygen-free copper plate | 2.5 mm square copper | 35.5 | Excellent |
| Example 3 | 15 | 15 | 210.5 | Oxygen-free copper plate | 2.5 mm square copper | 16.5 | Excellent |
| Example 4 | 50 | 15 | 185.6 | Oxygen-free copper plate | 2.5 mm square copper | 18.1 | Excellent |
| Example 5 | 15 | 77 | 9.6 | Oxygen-free copper plate | 2.5 mm square copper | 15.5 | Excellent |
| Example 6 | 50 | 77 | 9.8 | Oxygen-free copper plate | 2.5 mm square copper | 15.2 | Excellent |
| Example 7 | 15 | 67 | 18.9 | Oxygen-free copper plate | 2.5 mm square copper | 17.5 | Excellent |
| Example 8 | 50 | 67 | 16.4 | Oxygen-free copper plate | 2.5 mm square copper | 19.8 | Excellent |
| Example 9 | 15 | 50 | 30.1 | Oxygen-free copper plate | 2.5 mm square copper | 25.5 | Excellent |
| Example 10 | 50 | 50 | 28.7 | Oxygen-free copper plate | 2.5 mm square copper | 23.1 | Excellent |
| Example 11 | 15 | 11 | 849.0 | Oxygen-free copper plate | 2.5 mm square copper | 16.5 | Excellent |
| Example 12 | 50 | 11 | 835.0 | Oxygen-free copper plate/Ni | 2.5 mm square copper | 15.4 | Excellent |

TABLE 2-continued

| | | Average | Average particle | Bonded body | | | |
|---|---|---|---|---|---|---|---|
| | Thickness of copper sheet (μm) | porosity of preform layer (%) | diameter of copper nanoparticles (nm) | Type of substrate | Chip | Bonding strength (MPa) | Bonding evaluation |
| Comparative Example 1 | 15 | 9 | 871.0 | Oxygen-free copper plate | 2.5 mm square copper | 10.1 | Good |
| Comparative Example 2 | 50 | 9 | 885.0 | Oxygen-free copper plate | 2.5 mm square copper | 12.1 | Good |
| Comparative Example 3 | 15 | 83 | 8.4 | Oxygen-free copper plate | 2.5 mm square copper | — | Fail |
| Comparative Example 4 | 50 | 83 | 9.2 | Oxygen-free copper plate | 2.5 mm square copper | — | Fail |
| Comparative Example 5 | 15 | 25 | 950.1 | Oxygen-free copper plate/Ni | 2.5 mm square copper | 3.9 | Good |
| Comparative Example 6 | 15 | 9 | 671.3 | Oxygen-free copper plate | 2.5 mm square copper | 4.1 | Good |

As is clear from Table 2, in Comparative Example 1 and Comparative Example 2, the average porosities were 9% and 9%, which were smaller than the above-mentioned lower limit value of 11%. In addition, the average particle diameters of the copper nanoparticles calculated from the BET value were 871.0 nm and 885.0 nm, which were larger than the above-mentioned upper limit value of 850 nm. For these reasons, the bonding sheets of Comparative Examples 1 and 2 were not porous bodies that were optimal for bonding. Therefore, even in a case where the substrate and chip were bonded through each of the bonding sheets of Comparative Examples 1 and 2, the bonding strength remained in a range of 10.1 MPa to 12.1 MPa, although the substrate and chip were bonded; and therefore, the bonding evaluation was "Good".

In Comparative Example 3 and Comparative Example 4, the average porosities were 83% and 83%, which were higher than the above-mentioned upper limit value of 78%. In addition, the average particle diameters of the copper nanoparticles calculated from the BET value were 8.4 nm and 9.2 nm, which were smaller than the above-mentioned lower limit value of 9.59 nm. As a result, the strength of the porous preform layers on both surfaces of the copper sheet became weak, so that the sheet could not be used as the bonding sheet. Even in a case where the substrate and the chip were bonded through each of the bonding sheets of Comparative Examples 3 and 4, the substrate and the chip were not bonded, so the bonding evaluation was "Fail".

In Comparative Example 5, the average porosity was 25% falling in the above-mentioned range, which was satisfactory as the porosity, but the average particle diameter calculated from the BET value was 950.1 nm, which was larger than the above-mentioned upper limit value of 850 nm. For this reason, the bonding sheet of Comparative Example 5 did not have sufficient sinterability, and the bonding strength remained at 3.9 MPa.

In addition, in Comparative Example 6, the average particle diameter was 671.3 nm falling in the above-mentioned range, but the average porosity was 9%, which was lower than the above-mentioned lower limit value of 11%. For this reason, although the average particle diameter was sufficiently small, the bonding sheet of Comparative Example 6 had insufficient porosity that contributed to sintering; and thereby, the bonding strength remained at 4.1 MPa. As a result, even in a case where the substrate and chip were bonded through each of the bonding sheets of Comparative Examples 5 and 6, the bonding evaluation was "Good".

On the other hand, in Examples 1 to 12, the average porosity of the preform layer and the average particle diameter calculated from the BET value were appropriately controlled. A porous preform layer including copper particles, in which the average porosity of the preform layer was within the above-mentioned range of 11% or more and 78% or less and the average particle diameter of the copper nanoparticles calculated from the BET value was also within the above-mentioned range of 9.59 nm to 850 nm, was formed on both surfaces of the copper sheet. In a case where the substrate and the chip were bonded through each of the bonding sheets of Examples 1 to 12, the substrate and the chip were firmly bonded; and therefore, the bonding evaluations were all "Excellent".

Example 13

(Manufacturing Example of to-be-Bonded Member by Method of Second Embodiment)

As shown in FIG. 5(a), first, a 33 mm square oxygen-free copper plate (thickness: 2 mm) was used as the substrate 46 corresponding to the copper sheet of Example 1. The substrate 46 was treated in the same manner as in Example 1 prior to copper plating. As shown in FIG. 5(b), the resist film 41 was formed on the substrate 46 except for the bonding surface 46a (14 mm square) to which a chip 47, which was an electronic component, was bonded. In this state, a copper-zinc plated film was formed on one surface of the substrate 46 by using the plating apparatus 30 shown in FIG. 3. Table 3 which will be given later shows characteristic items among the composition of the plating bath and plating conditions of Example 13.

[Composition]

Copper sulfate pentahydrate (as $Cu^{2+}$): 0.01 mol/L

Zinc sulfate heptahydrate (as $Zn^{2+}$): 0.15 mol/L

Potassium pyrophosphate: 0.3 mol/L (Ethylenedinitrilo)tetrakis(2-propanol): 0.01 mol/L Serine which was an amino acid: 0.001 mol/L Ion exchange water: balance

[Plating Conditions]

Bath temperature: 30° C.

pH of bath: 8.6

Cathode current density: 0.5 A/dm$^2$

TABLE 3

| | Type of substrate | Concentration of copper sulfate pentahydrate (mol/L) | Concentration of zinc sulfate heptahydrate (mol/L) | Concentration of potassium pyrophosphate (mol/L) | Concentration of trisodium citrate (mol/L) | Concentration of (ethylenedinitrilo) tetrakis(2-propanol) (mol/L) | Concentration of amino acid (serine) (mol/L) | pH of plating bath | Cathode current density (A/dm$^2$) |
|---|---|---|---|---|---|---|---|---|---|
| Example 13 | Oxygen-free copper plate | 0.01 | 0.15 | 0.3 | — | 0.01 | 0.001 | 8.6 | 0.5 |
| Example 14 | Oxygen-free copper plate/Ni | 0.01 | 0.15 | 0.3 | | 0.01 | 0.001 | 8.6 | 0.5 |
| Example 15 | Oxygen-free copper plate | 0.01 | 0.15 | 0.3 | — | 0.01 | 0.001 | 8.6 | 0.3 |
| Example 16 | Oxygen-free copper plate/Ni | 0.0 | 0.15 | 0.3 | — | 0.01 | 0.001 | 8.6 | 0.3 |
| Example 17 | Oxygen-free copper plate | 0.0025 | 0.3 | — | 0.5 | 0.02 | 0.1 | 6.3 | 0.5 |
| Example 18 | Oxygen-free copper plate | 0.0025 | 0.3 | — | 0.5 | 0.02 | 0.1 | 6.3 | 0.3 |
| Example 19 | Oxygen-free copper plate | 0.01 | 0.3 | — | 0.5 | 0.02 | 0.1 | 6.3 | 0.5 |
| Example 20 | Oxygen-free copper plate | 0.01 | 0.3 | — | 0.5 | — | 0.1 | 6.3 | 0.3 |
| Comparative Example 7 | Oxygen-free copper plate | 0.5 | 0.1 | 0.5 | — | 0.1 | 0.1 | 4.5 | 0.2 |
| Comparative Example 8 | Oxygen-free copper plate | 0.0015 | 0.3 | — | 0.5 | 0.1 | 0.2 | 6.1 | 0.5 |
| Comparative Example 9 | Oxygen-free copper plate | 0.01 | 0.15 | 0.3 | — | — | — | 8.6 | 0.5 |
| Comparative Example 10 | Oxygen-free copper plate | 0.01 | 0.15 | 0.3 | — | 0.01 | 1.0 | 8.6 | 0.5 |

Figure 7A:
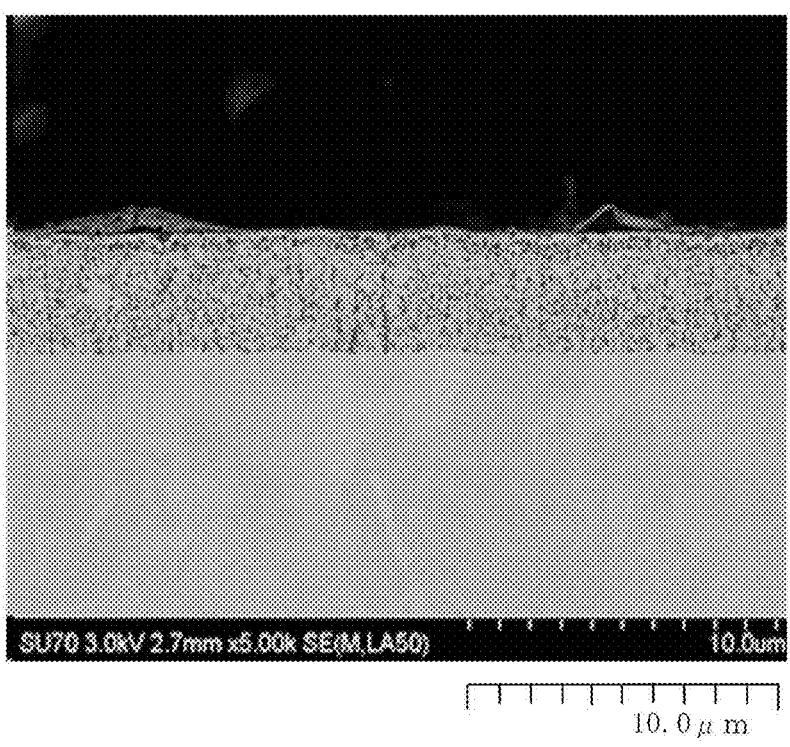
FIG. 7A is a scanning electron micrograph of a longitudinal cross section of a preform layer of Example 13 manufactured by the method according to the second embodiment of the present invention, and is a longitudinal cross sectional micrograph of a copper base plate and a preform layer formed on the base plate.
Figure 7B:
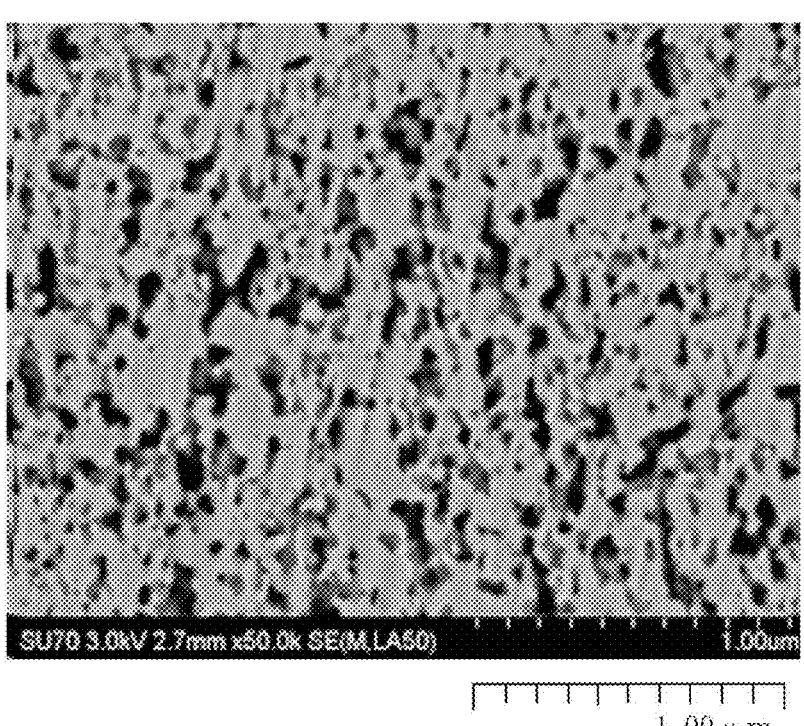
FIG. 7B is a scanning electron micrograph of a longitudinal cross section of the preform layer of Example 13 manufactured by the method according to the second embodiment of the present invention, and is an enlarged longitudinal cross sectional micrograph of a portion of the preform layer.

The copper-zinc plated film produced under the above-described conditions was immersed in a solution containing hydrochloric acid at a concentration of 0.05 mol/L at 27° C., and the solution was stirred for 60 minutes. As a result, zinc was removed by dealloying from the copper-zinc alloy plated film. In order to prevent the surface oxidation of the dealloyed substrate, the substrate was subjected to a rust-inhibiting treatment by being immersed in a rust inhibitor containing benzotriazole and a surfactant as main components for 30 seconds. As a result, the to-be-bonded member 40 having the porous preform layer 13 including copper particles formed on the bonding surface 46a of the substrate 46 (see FIG. 5(d)) was obtained. FIG. 7A shows a scanning electron micrograph of a longitudinal cross section of the preform layer and the substrate (oxygen-free copper plate) of Example 13. In addition, FIG. 7B shows an enlarged longitudinal cross sectional micrograph of a portion of the preform layer.

Examples 14 to 20 and Comparative Examples 7 to 10

In Examples 14 to 20 and Comparative Examples 7 to 10, the type of the substrate was the same as in Example 13 or changed. The concentration of copper sulfate pentahydrate was the same as in Example 13 or changed. The concentration of zinc sulfate heptahydrate was the same as in Example 13 or changed. The concentration of potassium pyrophosphate or the concentration of trisodium citrate was the same as in Example 13 or changed. The concentration of (ethylenedinitrilo)tetrakis(2-propanol) was the same as in Example 13 or changed. The concentration of the amino acid was the same as in Example 13 or changed. In addition, the pH of the plating bath was the same as in Example 13 or changed. The cathode current density at the time of plating was the same as in Example 13 or changed. A copper-zinc plated film was formed in the same manner as in Example 13 except for the above-described matters. Table 3 above shows characteristic items among the composition of the plating bath and plating conditions of each of Examples 14 to 20 and Comparative Examples 7 to 10.

<Comparison Evaluation 2>

<BET Specific Surface Area of Copper Particles Constituting Porous Preform Layer>

The average porosity of the porous preform layer on each of the 12 types of substrates obtained in Examples 13 to 20 and Comparative Examples 7 to 10, and the average particle diameter of the copper nanoparticles that coated the copper particles constituting the preform layer were measured by the same method as the method described in the section of <Comparison evaluation 1>. Table 4 shows the results.

<Manufacturing of Bonded Body>

As shown in FIG. 5(e) to FIG. 5(h), the chip 47 consisting of a 2.5 mm square or 10 mm square Si wafer (thickness: 200 μm) of which the outermost surface (bonding surface) was subjected to copper metallization was placed on the porous preform layer 13 on the surface of the base plate consisting of each of the 12 types of substrates 46 obtained in Examples 13 to 20 and Comparative Examples 7 to 10, and the substrate 46 and the electronic component 47 were heated while being pressurized to obtain the bonded body 44. This bonding was carried out by the same method as the method described in the section of <Comparison evaluation 1>. The shear strengths of these 12 types of bonded bodies 44 were measured by the same method as the method described in the section of <Comparison evaluation 1>. The shear strengths of the 12 types of bonded bodies are shown in Table 4 below. The bonding evaluation was the same as the bonding evaluation described in the section of <Comparison evaluation 1>.

TABLE 4

| | Average porosity of preform layer (%) | Average particle diameter of copper nanoparticles (nm) | Bonded body | | | |
| | | | Type of substrate | Chip | Bonding strength (MPa) | Bonding evaluation |
|---|---|---|---|---|---|---|
| Example 13 | 38 | 62.4 | Oxygen-free copper plate | 2.5 mm square copper | 41.2 | Excellent |
| Example 14 | 37 | 62.4 | Oxygen-free copper plate/Ni | 2.5 mm square copper | 38.5 | Excellent |
| Example 15 | 16 | 211.1 | Oxygen-free copper plate | 10 mm square copper | 20.1 | Excellent |
| Example 16 | 17 | 211.1 | Oxygen-free copper plate/Ni | 10 mm square copper | 19.5 | Excellent |
| Example 17 | 78 | 9.06 | Oxygen-free copper plate | 2.5 mm square copper | 18.4 | Excellent |
| Example 18 | 66 | 18.5 | Oxygen-free copper plate | 2.5 mm square copper | 22.4 | Excellent |
| Example 19 | 53 | 32.4 | Oxygen-free copper plate | 10 mm square copper | 21.5 | Excellent |
| Example 20 | 12 | 848.4 | Oxygen-free copper plate | 10 mm square copper | 18.7 | Excellent |
| Comparative Example 7 | 9 | 855.0 | Oxygen-free copper plate | 2.5 mm square copper | 12.5 | Good |
| Comparative Example 8 | 84 | 8.1 | Oxygen-free copper plate | 2.5 mm square copper | 0.8 | Fail |
| Comparative Example 9 | 23 | 921.5 | Oxygen-free copper plate | 2.5 mm square copper | 5.8 | Good |
| Comparative Example 10 | 10 | 640.4 | Oxygen-free copper plate | 2.5 mm square copper | 6.7 | Good |

As is clear from Table 4, in Comparative Example 7 and Comparative Example 8, both the average porosity and the average particle diameter were out of the above-mentioned ranges.

In Comparative Example 7, the average porosity was smaller than the above-mentioned range, the bonding sheet of Comparative Example 7 lacked the porosity necessary for sintering, and the average particle diameter was larger than the above-mentioned range; and thereby, the sintering of the copper particles did not proceed and the degree of porosity of the preform layer was insufficient.

In Comparative Example 8, the average porosity was larger than the above-mentioned range and the average particle diameter was also below the above-mentioned range; and thereby, the preform layer of the bonding sheet of Comparative Example 8 was weak in strength and brittle.

Therefore, in Comparative Examples 7 and 8, even in a case where the substrate and the chip were bonded, the substrate and the chip were bonded; however, the bonding strength remained at 12.5 MPa and the bonding evaluation was "Good" in Comparative Example 7, and the bonding strength remained at 0.8 MPa and the bonding evaluation was "Fail" in Comparative Example 8.

In Comparative Example 9, the average porosity was within the above-mentioned range, which was satisfactory as the porosity, but the average particle diameter calculated from the BET value was larger than 850 nm. Therefore, the bonding sheet of Comparative Example 9 did not have sufficient sinterability, and the bonding strength remained at 5.8 MPa.

In addition, in Comparative Example 10, the average particle diameter was within the above-mentioned range, but the average porosity was out of the above-mentioned range. Therefore, although the average particle diameter was sufficiently small, the bonding sheet of Comparative Example 10 lacked the porosity that contributed to sintering; and thereby, the bonding strength remained at 6.7 MPa and the bonding evaluation was "Good".

On the other hand, in Examples 13 to 20, the average porosity of the preform layer formed by dealloying of zinc on one surface of the substrate was within the above-mentioned range of 11% or more and 78% or less. In addition, a porous preform layer including copper particles in which the average particle diameter of the copper nanoparticles calculated from the BET value was also within the above-mentioned range of 9.59 nm to 850 nm was formed. In a case where the chip, which was an electronic component, was placed on the to-be-bonded member, in which the preform layer was formed on the substrate of each of Examples 13 to 20, to bond the to-be-bonded member and the chip, the to-be-bonded member and the chip were firmly bonded, and the bonding evaluations were all "Excellent".

INDUSTRIAL APPLICABILITY

The bonding sheet of the present embodiment can be used to bond an electronic component to a base plate by being interposed between the electronic component and the base plate.

REFERENCE SIGNS LIST

10, 20: bonding sheet
11: copper sheet
12: copper particle
12a: copper nanoparticle
13: preform layer
15, 45: bonding layer
16, 46: substrate
17, 47: electronic component
18, 44: bonded body
31: electrolytic tank
32: plating solution
33: anode
34: lead wire
35: DC power supply
40: to-be-bonded member

What is claimed is:

1. A bonding sheet with a porous preform layer, which is a bonding sheet for bonding a substrate and an electronic component, the bonding sheet comprising:
   a copper sheet; and
   the porous preform layer including copper particles provided on one surface or both surfaces of the copper sheet,
   wherein surfaces of the copper particles are coated with copper nanoparticles having an average particle diameter smaller than an average particle diameter of the copper particles, the average particle diameter of the copper nanoparticles calculated from a BET value is 61.8 nm or more and 850 nm or less, an average porosity of the preform layer is 11% or more and 78% or less, and the average porosity of the preform layer is an arithmetic average of a porosity (P) obtained by the following Expression (1), based on a total area ($S_1$) of the preform layer and an area ($S_2$) of a pore portion in the preform layer, both of which are calculated by image analysis of a cross section of the bonding sheet with a scanning electron microscope, $$P(\%)=(S_2/S_1)\times100 \tag{1}.$$

2. A method for manufacturing a bonded body, comprising:

a step of laminating a substrate, the bonding sheet with the porous preform layer according to claim 1, and an electronic component in this order to obtain a laminate; and a step of heating the laminate in a state of being pressurized in a lamination direction to obtain a bonded body.

3. A method for manufacturing a bonded body, comprising:

a step of preparing a substrate and an electronic component which are to be bonded to each other, in which either one or both of a bonding surface of the substrate and a bonding surface of the electronic component are each a copper surface or a nickel surface;

a step of forming a porous preform layer on one or both of the bonding surfaces;

a step of laminating the substrate and the electronic component in a state where one or two of the porous preform layers are interposed between the substrate and the electronic component to obtain a laminate; and a step of heating the laminate in a state of being pressurized in a lamination direction to obtain a bonded body, wherein the porous preform layer is not sintered before the step of heating, wherein the porous preform layer includes copper particles, surfaces of the copper particles are coated with copper nanoparticles having an average particle diameter smaller than an average particle diameter of the copper particles, the average particle diameter of the copper nanoparticles calculated from a BET value is 61.8 nm or more and 850 nm or less, an average porosity of the porous preform layer is 11% or more and 78% or less, and the average porosity of the porous preform layer is an arithmetic average of a porosity (P) obtained by the following Expression (1), based on a total area ($S_1$) of the porous preform layer and an area ($S_2$) of a pore portion in the porous preform layer, both of which are calculated by image analysis of a cross section of the porous preform layer with a scanning electron microscope, $$P(\%)=(S_2/S_1)\times100 \tag{1}.$$

4. A to-be-bonded member with a porous preform layer, which is either one of an electronic component or a substrate to be bonded to each other, the to-be-bonded member comprising:

a copper surface or a nickel surface; and the porous preform layer provided on the copper surface or the nickel surface, wherein the porous preform layer includes copper particles, surfaces of the copper particles are coated with copper nanoparticles having an average particle diameter smaller than an average particle diameter of the copper particles, the average particle diameter of the copper nanoparticles calculated from a BET value is 61.8 nm or more and 850 nm or less, an average porosity of the porous preform layer is 11% or more and 78% or less, the average porosity of the porous preform layer is an arithmetic average of a porosity (P) obtained by the following Expression (1), based on a total area ($S_1$) of the porous preform layer and an area ($S_2$) of a pore portion in the porous preform layer, both of which are calculated by image analysis of a cross section of the porous preform layer with a scanning electron microscope, $$P(\%)=(S_2/S_1)\times100 \tag{1},$$

and to-be-bonded member includes the porous preform layer and either one of the electronic component or the substrate.

* * * * *